United States Patent
Manley et al.

(10) Patent No.: US 8,707,113 B1
(45) Date of Patent: Apr. 22, 2014

(54) METHOD FOR MODELING A DEVICE AND GENERATING TEST FOR THAT DEVICE

(75) Inventors: Douglas Manley, Fort Collins, CO (US); Randy A. Coverstone, Newark, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 409 days.

(21) Appl. No.: 13/013,743

(22) Filed: Jan. 25, 2011

(51) Int. Cl.
*G01R 31/28* (2006.01)
*G01R 31/00* (2006.01)
*G01R 31/02* (2006.01)
*G06F 15/00* (2006.01)
*G06F 17/10* (2006.01)
*G06F 17/50* (2006.01)
*G06F 9/455* (2006.01)

(52) U.S. Cl.
USPC ........... 714/724; 714/726; 714/733; 714/735; 714/741; 714/742; 702/58; 702/67; 702/68; 702/71; 702/117; 702/118; 702/125; 703/2; 703/15; 703/20; 703/28

(58) Field of Classification Search
USPC .............. 714/724, 726, 733, 735, 741, 742; 702/58, 67, 68, 71, 117, 118, 125; 703/2, 15, 20, 28
See application file for complete search history.

(56) References Cited

U.S. PATENT DOCUMENTS

| | | | | |
|---|---|---|---|---|
| 5,922,079 A * | 7/1999 | Booth et al. | ..................... | 714/26 |
| 5,960,191 A * | 9/1999 | Sample et al. | .................. | 703/28 |
| 6,002,861 A * | 12/1999 | Butts et al. | ....................... | 703/16 |
| 6,026,230 A * | 2/2000 | Lin et al. | ......................... | 703/13 |
| 6,377,912 B1 * | 4/2002 | Sample et al. | .................. | 703/28 |
| 6,421,624 B1 * | 7/2002 | Nakayama et al. | ........... | 702/117 |
| 6,694,464 B1 * | 2/2004 | Quayle et al. | ................. | 714/725 |
| 6,732,068 B2 * | 5/2004 | Sample et al. | .................. | 703/24 |
| 7,203,922 B2 * | 4/2007 | Hamilton et al. | ............. | 716/102 |
| 7,359,814 B1 * | 4/2008 | Nakayama et al. | ............. | 702/85 |
| 7,487,077 B1 * | 2/2009 | Clune et al. | ..................... | 703/17 |
| 7,640,154 B1 * | 12/2009 | Clune et al. | ..................... | 703/22 |
| 2004/0078179 A1 * | 4/2004 | Fuji et al. | ......................... | 703/15 |
| 2008/0288184 A1 * | 11/2008 | Giurgiutiu et al. | .............. | 702/35 |
| 2008/0306722 A1 * | 12/2008 | Fujii et al. | ........................ | 703/15 |

OTHER PUBLICATIONS

MathWorks, Inc., Multiport Switch—Choose between multiple block inputs, MathWorks, Inc., pp. 1-19.*

* cited by examiner

*Primary Examiner* — John J Tabone, Jr.

(57) ABSTRACT

A method for operating a data processing system to generate a test for a device under test (DUT) is disclosed. The method utilizes a model of the DUT that includes a plurality of blocks connected by wires and a set of control inputs. Each block includes a plurality of ports, each port being either active or inactive. Each block is also characterized by a set of constraints that limit which ports are active. The active ports of at least one of the blocks are constrained by one of the control inputs. A test vector having one component for each port of each block and one component for each control input is determined such that each set of constraints for each block is satisfied. The test vector defines a test for the DUT.

16 Claims, 4 Drawing Sheets

METHOD FOR MODELING A DEVICE AND GENERATING TEST FOR THAT DEVICE

BACKGROUND OF THE INVENTION

Modern electronic devices and/or systems are often constructed from a number of functional blocks that are connected together. These devices have signal inputs and signal outputs as well as control inputs that specify the state of various components in the device. The number of possible signal paths and operating configurations of even relatively simple devices can present problems for a test engineer who must design a series of tests to determine if the device is functioning as designed, and if it is not so functioning, isolating the component that has failed so that the component can be replaced.

Consider a simple device that has ten stages that are connected in series with each stage having two possible functional blocks that are selected by setting a switch that is part of each stage. There are 1024 possible different signal paths through the device depending on the settings of the switches. In principle, one could run tests using each of the configurations; however, even in this simple example, the testing workload and/or time can be prohibitive, particularly if each configuration requires that some parameter in the input signal such as frequency be swept over a large number of values and the outputs for each frequency analyzed.

It would be advantageous to be able to automatically design a minimum set of test configurations that "exercise" each component in the device under test (DUT). If any of the exercise tests fail, a second set of tests would then be used to isolate the defective component. Again, it would be advantageous to provide a system that automatically designs a minimum isolation test set that allows the test engineer to isolate the problem to a single component.

It would also be advantageous to provide a system that facilitates the design of the device and tests by providing additional test points within the device that would allow for more efficient testing. The design engineer is primarily concerned with providing a device that works for its intended purpose assuming all of the functional blocks perform as designed. However, the design engineer often does not have the ability to determine the most efficient use of test points within the device. That is, given a design, are there one or more additional test points that could be incorporated in the device that would significantly reduce the size of the exercise or isolation test sets for that device?

Finally, the individuals who design a device are not necessarily the individuals who must design the test system for the device. At the end of the design process, it would be advantageous to provide a graphical description of the device that facilitates the testing of the device during test and repairs. Ideally, such a description captures the design in a manner that facilitates the documentation of the device so that test engineers and technicians can quickly understand the layout of the device and the components that are currently being tested.

SUMMARY OF THE INVENTION

The present invention includes a method for operating a data processing system to generate a test for a DUT and a method for modeling that DUT. The model of the DUT includes a plurality of blocks connected by wires and a set of control inputs. Each block includes a plurality of ports, each port being either active or inactive. Each block is also characterized by a set of constraints that limit which ports are active. The active ports of at least one of the blocks are constrained by one of the control inputs. A test vector having one component for each port of each block and one component for each control input is determined such that each set of constraints for each block is satisfied. The test vector defines a permitted test for the DUT.

DETAILED DESCRIPTION OF PREFERRED EMBODIMENTS OF THE INVENTION

A DUT on which the present invention operates is modeled as consisting of a plurality of functional blocks connected by wires. In one aspect of the invention, the DUT is described by a directed flow graph containing a collection of blocks and wires. The present invention then builds an internal representation of the DUT from this representation. The representation of the DUT also includes a number of control parameters that specify control signals that alter the connections, in particular blocks or other global inputs to the device. These input signals will be referred to as control inputs in the following discussion. The model can also include a set of constraints that constrain the operation of one or more of the blocks.

Each block has a number of input and output ports. In addition, a block may have an internal state that is constrained by one of the control inputs. For example, a block may be capable of providing a plurality of functions that are determined by one or more of the control inputs.

For any given test to be performed on the DUT, a test path through one or more of the blocks must be determined. Determining the test path through each block involves determining which ports are active (i.e. which ports will convey signals that are ultimately visible at a test point associated with the test), and which internal functions will be active. Port and function activation for each block may be constrained by the control inputs. In addition, many blocks have constraints that restrict the ports that can be active at any given time independent of the control inputs.

Each block is modeled by a set of constraint equations or inequalities that constrain the activation of the block's input ports, output ports, and internal states. To simplify the following discussion, the term constraint equation is defined to include a constraint inequality. The constraint equations depend on the nature of the block, and any input parameters to the block such as the control inputs. These constraint equations may be generated automatically by the present invention for some predetermined types of blocks or are provided by the user/developer for custom blocks.

Wires are used to provide connectivity information. Each wire has a source and one or more sinks. Each source corresponds to an output port of some block or a signal input to the DUT. Each sink corresponds to an input port of some block or a test point. Providing multiple sinks allows the present invention to implement branched connection schemes. In one sense, a wire provides a constraint in which the output of the source block is set equal to the input of the sink block, thereby coupling the constraint equations that characterize the source block and the sink block.

In one aspect of the invention, the developer uses a graphical interface to build the block diagram and interconnections choosing the blocks from a list of available blocks. The system of the present invention then compiles the constraint equations that govern the entire circuit by combining the constraints associated with each of the individual blocks. The manner in which compilation is performed will be discussed in more detail below.

As noted above, the functions of individual blocks can be altered by altering one or more control inputs that are set as part of a test. For example, the routing of a signal between two blocks could be determined by a switch whose state is determined by one or more of the control inputs. Similarly, the function performed by a block could be altered by the value of one of the control inputs. The switch in the previous example is a simple case of such a dependence. Similarly, the gain of an amplifier block could be set by one or more of the control inputs.

In one aspect of the present invention, a control input is assumed to take on one of a predetermined number of states. These control inputs are defined as part of the system design. As noted above, the system designer specifies the DUT in terms of the blocks that make up the DUT and the connections between these blocks. In addition, the system designer specifies a list of test control inputs and the range of values for each variable. For example, the designer might specify a control input, $t_1$, that can take on the values 1, 2, or 3. This control input will alter the operation of one or more blocks in the DUT. Hence, the designer must also specify how this variable is associated with each relevant block.

In another aspect of the invention, all of the variables are represented internally by vectors having binary variables that have a value of 1 if the variable has that value and a value of 0 if the variable does not have that value. For example, the variable $t_1$ discussed above would be represented by the vector $[b_1, b_2, b_3]$, where the $b_i$ is either 0 or 1. If $t_1=2$, the vector representation would be [0,1,0]. This representation has the advantage of providing a mechanism for writing constraint equations that can depend on multiple values of the variable in question. For example, the $t_1$ value [1,0,1] specifies that $t_1$ could have the values 1 or 3, but not 2.

Figure 1:
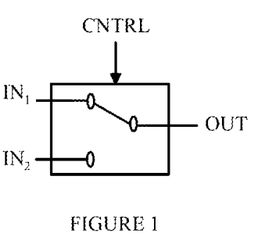
FIG. 1 illustrates a block consisting of a two-input port switch that connects one of the inputs to the output port depending on a state set by a control input.

Refer now to FIG. 1, which illustrates a block consisting of a two-input port switch that connects one of the inputs to the output port depending on a state set by a control input. For the purposes of this example, assume that the control input is determined by the test condition variable $t_1$ discussed above and that the switch is set to connect $IN_1$ to OUT if $t_1$ is equal to 1 or 2 and that the switch connects $IN_2$ to OUT if $t_1=3$. The switch state is represented by a vector $x=[IN_1, IN_2, OUT, t_1b_1, t_1b_2, t_1b_3]$. Here, $IN_1$, $IN_2$, OUT are equal to 1 if the corresponding port is active and 0 if the corresponding port is inactive.

The constraints for this block are as follows. First, each input port is active if the output port is active, and the test condition sets the switch to the position that sets that input port as active. As noted above, $IN_1$ is active if $t_1b_1$ or $t_1b_2$ is set to 1. Hence, this constraint is represented by the inequality:

$$2*OUT-2*IN_1+t_1b_1+t_1b_2 \le 2 \tag{1a}$$

Similarly, $IN_2$ is active if the test condition, $t_1b_3$ is one, and the output port is active. This leads to the constraint:

$$OUT-IN_2+t_1b_3 \le 1 \tag{1b}$$

In addition, each input port is active only if the output port is active and the test condition sets the switch to this position. This condition is expressed in the additional two constraints:

$$-2*OUT+3*IN_1-t_1b_1-t_1b_2 \le 0 \tag{1c}$$

$$-OUT+2*IN_2-t_1b_3 \le 0 \tag{1d}$$

Figure 2:
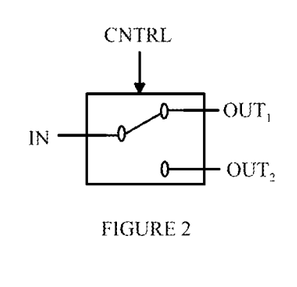
FIG. 2 illustrates a block consisting of a one-input port switch that connects the input to one of two output ports depending on a state set by a control input.

Refer now to FIG. 2, which illustrates a block consisting of a one-input port switch that connects the input to one of two output ports depending on a state set by a control input. For the purposes of this example, again assume that the control input is determined by the test condition variable $t_1$ discussed above and that the switch is set to connect $OUT_1$ if $t_1$ is equal to 1 or 2 and that $OUT_2$ is selected if $t_1=3$. The switch state is represented by a vector $x=[IN, OUT_1, OUT_2, t_1b_1, t_1b_2, t_1b_3]$.

The constraints for this block are as follows. First, each output port is active if the input port is active, and the test condition sets the switch to the position that sets that output port as active. As noted above, $OUT_1$ is active if $t_1b_1$ or $t_1b_2$ is set to 1. Hence, this constraint is represented by the inequality:

$$2*IN-2*OUT1+t_1b_1+t_1b_2 \le 2 \tag{2a}$$

Similarly, $OUT_2$ is active if the test condition, $t_1b_3$ is one, and the input port is active. This leads to the constraint:

$$OUT_2-IN+t_1b_3 \le 1 \tag{2b}$$

In addition, each output port is active only if the input port is active and the test condition sets the switch to this position. This condition is expressed in the additional two constraints:

$$-2*OUT_1+3*IN-t_1b_1-t_1b_2 \le 0 \tag{2c}$$

$$-OUT_2+2*IN-t_1b_3 \le 0 \tag{2d}$$

Figure 3:
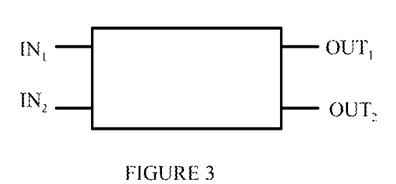
FIG. 3 illustrates a block having two inputs and two outputs, and that does not respond to any control inputs.

Refer now to FIG. 3, which illustrates a block having two inputs and two outputs, and that does not respond to test conditions. The vector describing this block is $[IN_1, IN_2, OUT_1, OUT_2]$. The generic constraints for such a block are that any active output port requires that all input ports be active, i.e., $$2*OUT_1-IN_1-IN_2 \le 0 \tag{3a}$$

$$2*OUT_2-IN_1-IN_2 \le 0 \tag{3b}$$

If no output port is active, then all input ports are inactive, i.e., $$-2*OUT_1-2*OUT_2+IN_1+IN_2 \le 0 \tag{3c}$$

Figure 4:
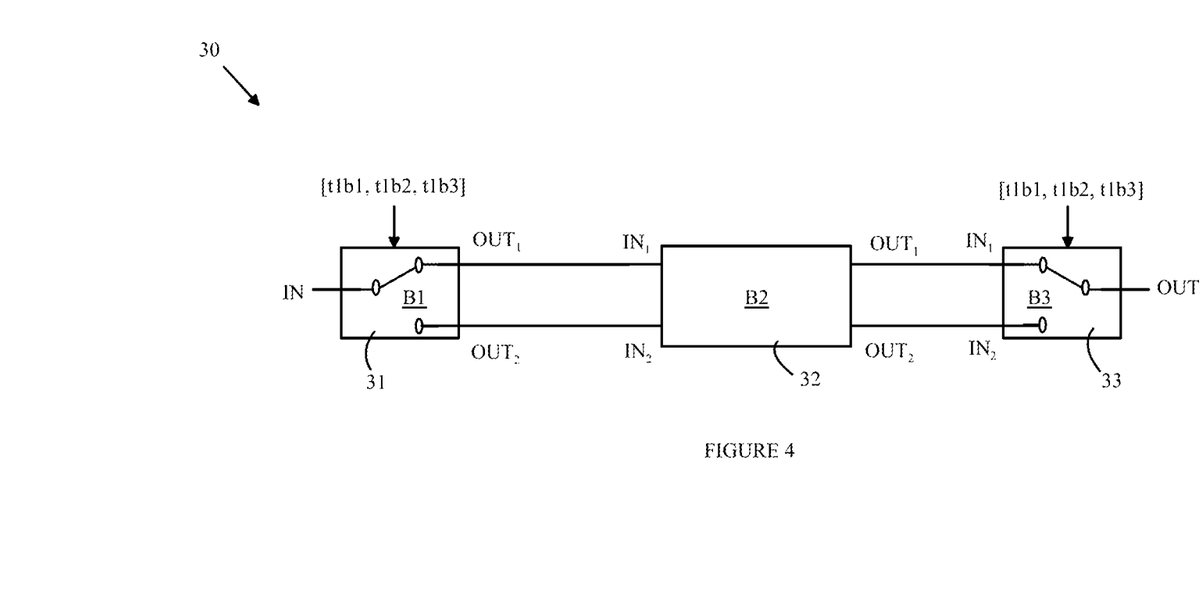
FIG. 4 illustrates a simple DUT constructed from the three blocks discussed above with respect to FIGS. 1-3.

Refer now to FIG. 4, which illustrates a simple DUT constructed from the three blocks discussed above with respect to FIGS. 1-3. DUT 30 consists of a two-output switch 31, labeled $B_1$ that connects the input to one of two input ports of block 32, labeled $B_2$, which is a generic block of the type discussed above with reference to FIG. 3. Finally, a two input switch 33 connects the outputs of block $B_3$ to an output port. The switches are controlled from a control input $t_1$ as discussed above.

$$2*B_1\_IN-2*B_1\_OUT_1+t_1b_1+t_1b_2 \le 2 \tag{4a}$$

$$B_1\_OUT_2-B_1\_IN+t_1b_3 \le 1 \tag{4b}$$

$$-2*B_1\_OUT_1+3*B_1\_IN-t_1b_1-t_1b_2 \le 0 \tag{4c}$$

$$-B_1\_OUT_2+2*B_1\_IN-t_1b_3 \le 0 \tag{4d}$$

$$2*B_2\_OUT_1-B_2\_IN_1-B_2\_IN_2 \le 0 \tag{4e}$$

$$2*B_2\_OUT_2 - B_2\_IN_1 - B_2\_IN_2 \leq 0 \tag{4f}$$

$$-2*B_2\_OUT_1 - 2*B_2\_OUT_2 + B_2\_IN_1 + B_2\_IN_2 \leq 0 \tag{4g}$$

$$2*B_3\_OUT_1 - 2*B_3\_IN_1 + t_1b_1 + t_1b_2 \leq 2 \tag{4h}$$

$$B_3\_OUT - B_3\_IN_2 + t_1b_3 \leq 1 \tag{4i}$$

$$-2*B_3\_OUT + 3*B_3\_IN_1 - t_1b_1 - t_1b_2 \leq 0 \tag{4j}$$

$$-B_3\_OUT + 2*B_3\_IN_2 - t_1b_3 \leq 0 \tag{4k}$$

$$B_1\_OUT_1 = B_2\_IN_1 \tag{4l}$$

$$B_1\_OUT_2 = B_2\_IN_2 \tag{4m}$$

$$B_3\_IN_1 = B_2\_OUT_1 \tag{4n}$$

$$B_3\_IN_2 = B_2\_OUT_2 \tag{4o}$$

A test is specified by a vector $$x = [B_1\_OUT_1, B_1\_OUT_2, B_2\_OUT_1, B_2\_OUT_2, t_1b_1, t_1b_2, t_1b_3]$$

Here, equations (4l)-(4o) have been used to eliminate the variables $B_2\_IN_1$, $B_2\_IN_2$, $B_3\_IN_1$, and $B_3\_IN_2$. These equations are also used to eliminate the variables in question from the remaining constraints. The remaining constraints can be written in the form of a matrix A as a system of the form $$Ax \leq y \tag{5}$$

where y is a vector determined by the substitutions in question. Any binary vector x that satisfies equation (5) is a possible test that can be performed. In this simple example, there are $2^7$ possible x vectors that can be tested to see if any satisfy Equation (5).

In general, there are a plurality of such tests. Hence, some additional criterion for determining the optimum list of tests is often useful. Since the DUT has been reduced to a mathematical model, the additional tests can be derived by specifying some of the parameters and then solving for vectors that satisfy the remaining tests.

One method for selecting tests of interest is to define a second vector having the same length as x and having weights for penalizing or emphasizing the desired results. Denote this vector by w. If we are interested in tests in which the $OUT_1$ ports are active, w=[-1,1,-1,1,0,0,0]. The scalar product w*x is minimized for tests that do not activate the $OUT_2$ ports. Hence, tests that minimize this product will be favored. In this simple example, there are two such tests, those for which $t_1b_1=1$ and those for which $t_1b_2=1$.

The vector w can also be used to provide other constraints. For example, if tests having one and only one control input are sought, w=[0,0,0,0,1,1,1] and the condition w*x=1 be imposed. This will pick only those tests for which one of $t_1b_1$, $t_1b_2$, and $t_1b_3$ is set. In another example, if only tests with $B_2\_OUT_2$ active are sought, w=[0,0,0,1,0,0,0] and the condition w*x=1 is again imposed.

In the above-described example, the equality constraints were utilized to further constrain the constraint equation system. However, in the more general case, each test vector x has a component for each input and output port of each block in the DUT. In addition, the wires that connect the blocks also have ports, i.e., sources and sinks. These ports can also be included in the test vector or just used to provide equality constraints between the ports connected by the wires. Finally, all of the control inputs are included in the test vector. The various constraints that govern the individual blocks are combined to provide the matrix A and vector y. Any value of x that satisfies the matrix test constraints Ax≤y is a valid test path through the DUT for the setting of the control inputs in that vector. The active ports from x define the path through the DUT.

It should be noted that commercially available software for solving the constraint problem in the case of a system of inequalities can be utilized. These programs are often referred to as constraints-based programming solvers. One class of these programs is optimized for solving very large systems of inequality constraints. In this case any equality constraints are replaced by inequality constraints. For example, a constraint of the form a=0 can be replaced by two constraints of the form a≤0 and a≥0. However, other programs that find test vectors that satisfy the constraints imposed by each block could be utilized.

In general, a large number of test vectors that satisfy the constraints will exist for any complex DUT. In one aspect of the invention, a subset of these possible tests is selected that has some particular characteristic. For example, a test set that exercises every block in the DUT in the minimum number of tests is useful in testing DUTs after manufacture for quality control purposes. Similarly, a test set that allows one to identify which block is malfunctioning when one of the "exercise" tests fails in the minimum number of tests is useful in repairing a DUT. Similarly, a test set having the fewest number of tests that exercise each signal path is desirable. The subset of tests can be selected by adding additional constraints to the constraint set or by utilizing post processing steps on the tests that satisfied the original constraints.

In one aspect of the present invention, test sets that provides specific information about the DUT in as few tests as possible are defined. These tests sets will be referred to as minimal test sets in the following discussion. One minimal test set of particular interest is the set that exercises each block in the DUT. If these tests are satisfied, the DUT is functioning correctly and further tests need not be made. If one or more of these "exercise" tests fails, a second set of tests of interest is the minimum set needed to determine which block is malfunctioning assuming only one of the blocks is malfunctioning. In addition, test sets that determine which blocks are malfunctioning assuming two blocks are malfunctioning can also be constructed, and so on.

Figure 5:
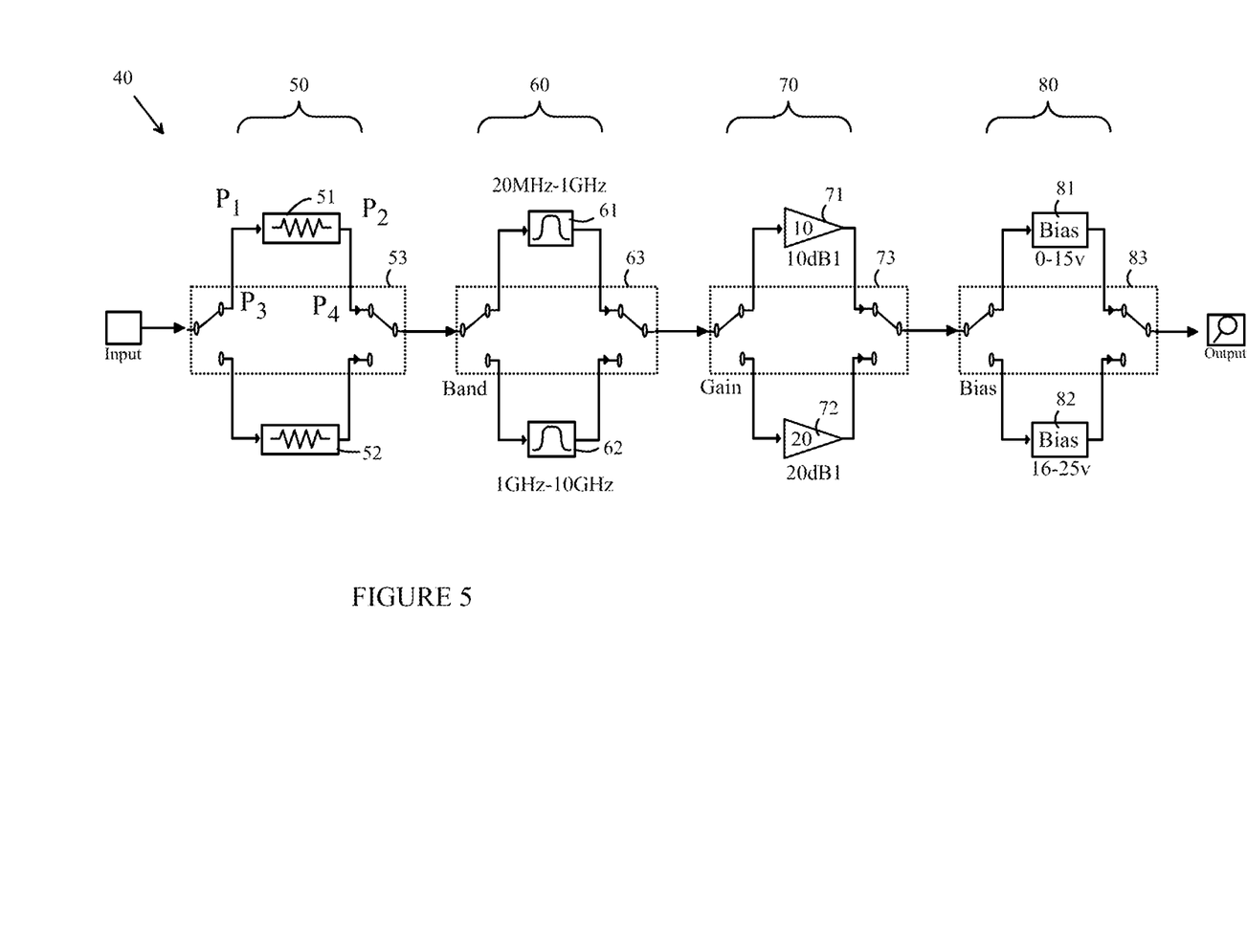
FIG. 5 is a block diagram of a more complex DUT.

Refer now to FIG. 5, which is a block diagram of a more complex DUT. DUT 40 includes four stages shown at 50, 60, 70, and 80. Each stage consists of two signal-processing blocks and a routing switch that either routes the signal from the input to the first of the processing blocks or the second of the processing blocks. For example, block 50 inserts either attenuator 51 or attenuator 52 into the signal path depending on the state of one or more of the control that control switch 53. Similarly, stage 60 inserts either bandpass filter 61 or bandpass filter 62 into the signal path depending on the state of switch 63, which is also controlled by one or more of the control inputs parameters that control switch 63. Stage 70 inserts a gain stage 71 or gain stage 72 depending on the state of switch 73. Finally, stage 80 adds a DC bias to the signal in a first range set by bias circuit 81 or a second range set by bias circuit 82 depending on the state of switch 83. It should be noted that the precise bias set may be controlled by other control inputs.

Figures 6, 7:
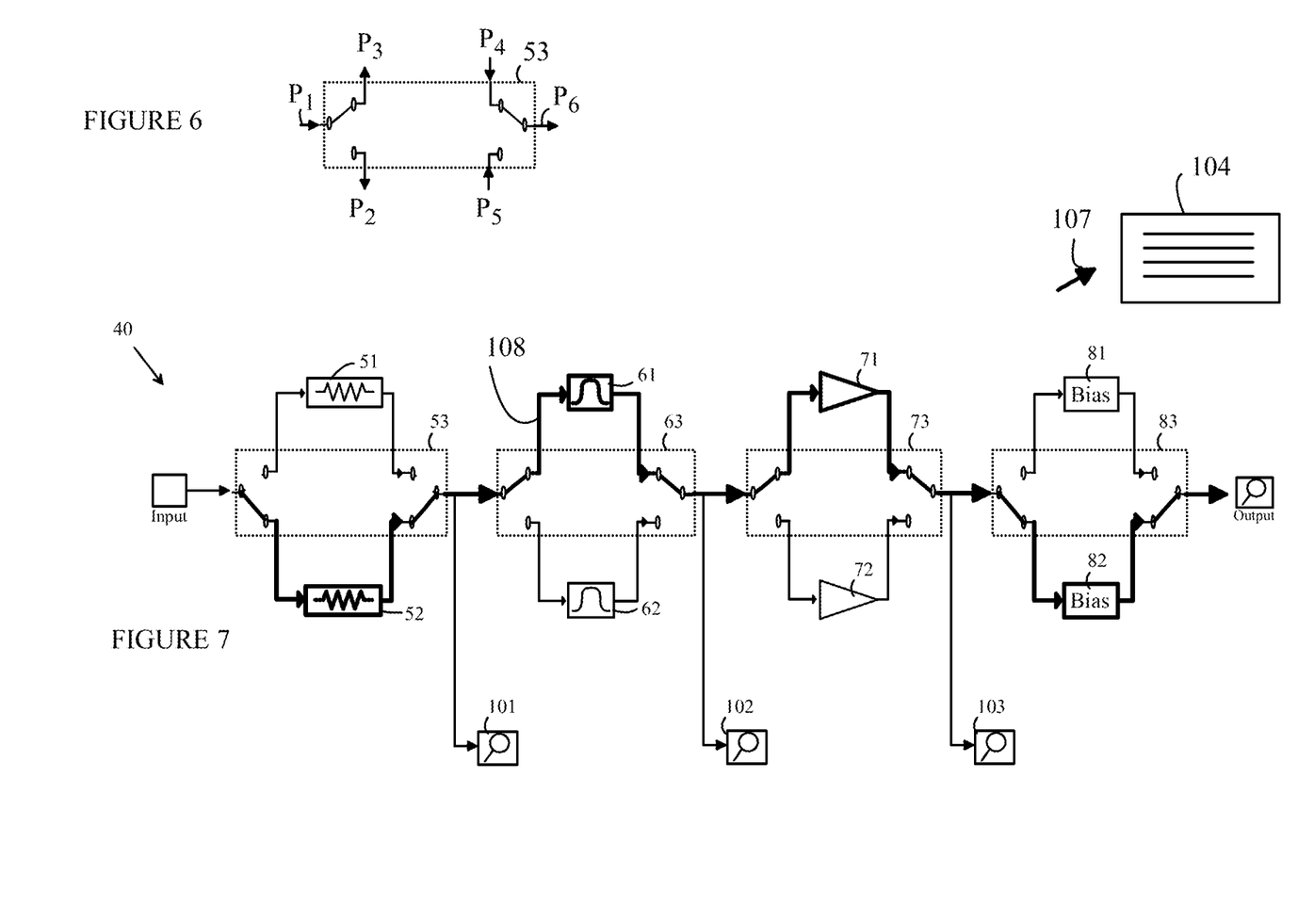
FIG. 6 is a more detailed view of routing switch 53 shown in FIG. 5.
FIG. 7 illustrates the blocks that are activated in one of these tests.

Refer now to FIG. 6, which is a more detailed view of routing switch 53 shown in FIG. 5. The routing switch blocks each have six ports, $P_i$, for i=1 to 6. Ports $P_1$, $P_4$, and $P_5$ are input ports and the remaining ports are output ports. In the following discussion, a binary variable characterizing the state of a port on a particular block will be denoted by "$P_i$, where n is the number of the block and i is the number of the port. For example, $^{53}P_2$ is the value associated with port $P_2$ on block 53.

The state of the block is specified by a vector having binary components. The components include one component for each of the ports. For the purposes of this discussion, the component corresponding to a port will be set to 1 if the port is active and 0 if the port is inactive. If the block has no internal state, the port vector P includes all of the state information. If the block has internal states, e.g., an internal memory whose value(s) is not determined uniquely by P, then the state vector will also have binary components that specify the possible values of the internal state. Denote these components by a second binary vector M. For example, the bias blocks 81 and 82 shown in FIG. 5 could each have an internal variable that determines the magnitude of the offset voltage introduced by the block. Hence, the state of the block can be specified by a vector having the components [P,M]. Denote the state of the $n^{th}$ block by the vector $^nS=[^nP,^nM]$.

The number of valid states for a block is, in general, much smaller than the number of possible states for the vector S characterizing the block. Consider routing switch 53. The routing switch has six ports, and no memory. Hence, S has $2^6=64$ possible states if each port could be independently set to be active or inactive independent of the other ports. However, switch 53 has only two valid states in practice. The first corresponds to attenuator 51 being switched into the circuit, that is, ports $P_1$, $P_3$, $P_4$, and $P_6$ are active, and ports $P_2$ and $P_5$ are inactive. The second corresponds to attenuator 52 being switched into the circuit, that is, ports $P_1$, $P_2$, $P_5$, and $P_6$ are active, and ports $P_3$ and $P_4$ are inactive.

The constraints associated with each block constrain the state vector values to those that are consistent with the internal structure of the block and the inputs to the block provided by the test conditions and the state of ports on other blocks that are connected to the block in question by wires. The constraints can include a number of inequalities that relate the elements of the state vector for the block and/or a number of equations. In one aspect of the invention, the inequalities and equations are both linear in the state vector components. In another aspect of the invention, the state vector components are binary.

The constraints and status vectors of two or more blocks that are connected by wires can be combined to provide a state vector and set of constraints for the combined blocks. For example, the status vector for the combination of blocks 51, 52, and 53 that forms stage 50 shown in FIG. 5 would be the vector $[^{51}S, ^{52}S, ^{53}S]=^{50}S$. The test vector for the combined block is the concatenation of the status vector and the vector representing the test conditions. Denote this vector by $^{50}x$. Then $^{50}x=[^{50}S, f]$, where f is the vector of test condition binary variables for the DUT. In this nomenclature, the constraints for the two blocks can be written in the form:

$$^{51}A^{51}x \leq ^{51}y \quad (6a)$$

$$^{52}A^{52}x \leq ^{52}y \quad (6b)$$

$$^{53}A^{53}x \leq ^{53}y, \quad (6c)$$

where the A's are the constraint matrices that represent the systems of constraints that govern the corresponding block. It should be noted that these three sets of constraints can be written in the form $$^{50}A^{50}x \leq ^{50}y. \quad (7)$$

The constraints captured by equation (7) do not take into account the additional constraints imposed by the wiring within the stage and between stages. These constraints will be referred to as connection constraints in the following discussion. In general, a wire connects a signal source, i.e., an output port of some block to one or more signal sinks. Each signal sink is an input port of some block. Consider the case of a wire that connects one source port, source_out, to two sink ports, $sink_1$_in and $sink_2$_in, i.e., the wire has a branch. The constraints imposed by the wire are that any output from the wire requires an input and that the input is not active if the output is not active. The first condition gives rise to the constraints $$Sink_1\_in-Source\_out \leq 0 \quad (8a)$$

$$Sink_2\_in-Source\_out \leq 0. \quad (8b)$$

The second condition gives rise to the constraint $$Source\_out-Sink_1\_in-Sink_2\_in \leq 0. \quad (8c)$$

In the case in which there is only one sink and one source, these constraints can be replaced by the simple equality constraint that Source_out=Sink_in. Hence, referring again to stage 50 in FIG. 5 and the port designations shown in FIG. 6, port $P_3$ of block 53 is connected to input port $P_1$ of block 51, and hence, $^{53}P_3=^{51}P_1$. Similar equalities can be derived for the remaining connections in the stage.

The connection constraints can be included in the other constraints shown in Equation (7). In this case, the matrix $^{50}A$, and vector $^{50}y$ would be replaced by new values that include the connection constraints.

Alternatively, the connection constraints can be used to reduce the number of variables that appear in test vectors if the connection constraints take the form of linear equations. Stage 50 has a test vector with ten port entries. However, the connection constraints can be used to replace four of the port values. For example, $^{53}P_3$ can be replaced by $^{51}P_1$ in the constraints and a new test vector that only depends on six ports and the control inputs. This leads to a set of constraints that is significantly less complex, and hence, requires less computational work to solve. Once the ports are determined for a valid test vector in this reduced set of constraints, the original test vector can be constructed using the equality constraints that were used in the reduction process.

The process of combining blocks is repeated until an overall test vector and constraint system is derived. The process of determining a valid test for the system is equivalent to determining a test vector that satisfies the overall system constraint. In general, there will be many different valid test vectors that satisfy the constraints. In one aspect of the invention, a secondary filtering is applied to the valid test vectors to pick minimal subsets of tests that provide specific functions. For example, a subset of the possible tests that assures that all blocks are exercised when the subset is performed is useful in detecting DUTs that are functioning normally with the minimal testing overhead.

For an n-block DUT, the test vector for the DUT as a whole can be written in the form $x=[^1S, ^2S, \ldots ^nS, f]$, where $^iS$ is the port activation vector for the $i^{th}$ block, including any internal state vectors, and f is the control input vector that is used in determining which ports are active within each block. The vector x is a binary vector. That is, each of its components has a value of 0 or 1. While one embodiment of the present invention utilizes binary vectors, it should be noted that the present invention is not limited to binary vectors.

It should be noted that there may be other parameters that alter the behavior of a block in a manner other than altering which ports in the block are active. For example, the bias blocks 81 and 82 shown in FIG. 5 may include inputs that set the magnitude of the bias offset provided by each block.

While those inputs may be varied during a particular test, they are not functional in selecting the test path for that test.

In one aspect of the present invention, test vectors that satisfy the constraint set are ranked using a weighting function that computes the scalar product of the test vector with a weight vector as described above. The value of the scalar product is then used to rank the test vectors. In one aspect of the invention, the weighting vector is also a binary vector of the same length as the test vectors.

The manner in which this procedure is used to select a particular test set can be more easily understood with reference again to FIG. 5. As noted above, one useful subset of test vectors is a set that exercises all of the blocks in the minimum number of tests. A block is defined to be active if one of its ports is active. Consider the eight non-switching blocks shown at 51, 52, 61, 62, 71, 72, 81, and 82. If a block is active, the input port to that block is active. For example, if block 51 is active, port $P_1$ on that block is active and the corresponding port activation bit in the test vector will be a 1. If the block is inactive, the corresponding bit will be 0. The corresponding weight vector has a 1 at the location corresponding to the input port of each of the blocks in question and 0 at all other locations. Hence, the scalar product of this weight vector and a test vector counts the number of the blocks in question that were active in the test. In the particular case shown in FIG. 5, each test vector has four blocks that are active. Hence, the first test of the test set can be any of these test vectors. Refer to FIG. 7, which illustrates the blocks that are activated in one of these tests. The chosen blocks are shown in bold. At least a second test is needed to exercise the remaining blocks.

To find the second test vector, the weighting function is altered by placing 0s at the positions corresponding to the input ports of the blocks selected in the first test, and the vector that maximizes the weighting function is determined. Hence, the second weighting vector selects tests by the number of blocks that are activated in that test but were not part of the set of blocks activated in the first test. Using this second weighting function, one test vector has a score of four and the remaining tests have lesser scores. The test vector having the score of four is the test that activates the remaining blocks shown in FIG. 7. This test vector becomes the second test in the set. Since all of the blocks are activated by one of these two tests, the set is complete. That is, this two-test set exercises all of the blocks in the DUT.

It should be noted that each test vector specifies a test configuration, not the actual test. The test vector determines the signal paths through the blocks and the control inputs that relate to these signal paths. The actual test requires a definition of the input signal for the test, the expected output signal, and any other parameters that determine the functioning of the blocks. For example, in the DUT shown in FIG. 5, a range of bias values might be tested for the selected bias block in one of the test configurations. The present invention provides the test paths for the tests, the circuit designer must provide the remaining aspects of the test.

Referring again to FIG. 5, if one of the two "exercise" tests fails, a second set of tests is needed to isolate the failure. There are 14 additional possible test paths through DUT 40. However, not all of these are equally useful in identifying which block has failed. Ideally, the optimal set of tests is a minimal set of tests that maximize the ability to isolate a fault that caused one of the exercise tests to fail.

In general, at the diagnosis stage, there is already a subset of tests that have been chosen and run, e.g., the exercise test set. The problem of finding an optimal set can be viewed as successively expanding this subset with new tests that have the property that the results of the new tests could not be obtained from a combination of the results of the tests already in the subset.

In one aspect of the present invention, the test set is expanded one test at a time by adding a test that provides new information that is not obtainable from the existing members of the test set. Denote the number of blocks in the DUT by N. Any given test will test some subset of these. That is, the test path passes through this subset of blocks. Assign a quality factor Q to each of the blocks in the DUT for i=1 to N. $Q_i=1$ if the block is performing to specification and 0 otherwise. For any given test, define a vector C having N components, one corresponding to each block. $C_i$ is set to 1 if the corresponding block is included in the test and 0 otherwise.

Assume that there are M tests in the set. The results of these tests are stored in a test vector T. $T_i$ is equal to the sum of the $Q_i$ values in the test if the test passed and 0 otherwise. Define an M×N matrix, R whose rows are the vectors, C discussed above. Consider the system of equations defined by $$R*Q=T$$

If M≥N and the rank of matrix R is equal to N, then the problem block can be diagnosed. At the start of the procedure, the test set has M<N. Consider a new test that is to be added to the test set. When a new test is added, M increases and a new matrix is created. If the rank of the new matrix does not increase relative to the previous matrix, the new test is not linearly independent of the tests already in the set, and hence, the test is rejected. If the new test increases the rank of R, then the test is kept. This process is repeated until either the rank R reaches N or no new tests are available. It should be noted that the constraint that a test increase the rank of R could be incorporated directly into the constraint set, such that only tests that increase the rank are found by the equation solver.

If the rank of R remains less than N, a new test point can be added to the DUT design to enable a further set of tests that use this test point instead of the DUT output. Additional possible test points are shown in FIG. 7 at 101-103.

The above-described subsets of permissible tests are provided as examples of the possible subsets. It should be understood that other subsets of permissible tests could be utilized. Accordingly, the present invention is not limited to these specific examples.

The present invention can also be used as a visualization tool for displaying the portions of the DUT that are active in each test. In one aspect of the present invention, the graphical representation of the DUT is used to communicate with the user. For example, if the user picks a test from a list of tests 104, the blocks in the DUT that are active in that test are highlighted in the visual display of the DUT in a manner analogous to that shown in FIG. 7. Similarly, the visual display can be used to communicate desired tests by pointing to a particular block and requesting a listing of all of the tests that utilize that block. In one aspect of the invention, the list of tests includes a description of the test and the control inputs that are active for that test.

It should also be noted that the model of the DUT used in the present invention and the DUT diagram that is displayed in the present invention also provide a means for storing information about the connectivity of the DUT in a form that is intuitively useful to members of the design and test teams. Hence, the present invention can be used to preserve design information about a DUT that leaves the engineering group to form part of a commercial product that must be maintained by a different group or groups of personnel.

In one aspect of the present invention, the method of the present invention is performed on a general purpose data processing system with a display screen on which the graphical representation of the DUT is displayed along with a list of tests. FIG. 7 is a typical display; however, other graphical representations could be utilized. In one mode of operation, the user selects a test from the list of tests in window 104 using a pointing device 107. The signal path through the DUT for that test is then highlighted in some manner. In the example shown in FIG. 7, the blocks and signal paths on the test path are highlighted by a change in intensity or color relative to the other blocks in the DUT as shown at 108. In another aspect of the invention, the user points to a specific block or signal path, and a list of tests that exercise that block or signal path is presented in window 104. In another aspect of the invention, additional information about a block, such as engineering notes, is displayed when the user selects a block with the pointing device. The information can be displayed in window 104 or a separate pop-up window.

It should be noted that for complex DUTs, the computational load imposed by solving for test vectors that satisfy the constraint set can be significant. In such situations, data processing systems that have multiple processors may be advantageously utilized.

The present invention may be embodied in a software program on any computer readable medium that constitutes patentable subject matter under 35 U.S.C. 101. The program in question including instructions that cause a data processing system to execute the methods described above and claimed herein.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method for operating a data processing system to generate a test for a device under test (DUT), said method comprising:
providing a model of said DUT comprising a plurality of blocks connected by wires and a set of control inputs, each block comprising a plurality of ports, each port being either active or inactive, each block being characterized by a set of constraints that limit which ports are active, each constraint in said set of constraints comprising an equation or inequality involving variables representing whether each port is active or inactive, at least one of said constraints in said set of constraints characterizing one of said plurality of blocks involving a variable representing one of said control inputs in said set of control inputs;
defining a test vector having one component for each port of each block of said plurality of blocks and one component for each control input in said set of control inputs; and
causing said data processing system to determine a valid test for said DUT by determining each component of said test vector such that each set of constraints for each block of said plurality of blocks is satisfied.

2. The method of claim 1 wherein each component of said test vector is binary.

3. The method of claim 1 further comprising generating a set of valid tests, said set of valid tests comprising a different test vector corresponding to each test of said set of valid tests, each of said test vectors satisfying each set of constraints for each block of said plurality of blocks.

4. The method of claim 3 wherein said set of valid tests tests each block of said plurality of blocks in said DUT.

5. The method of claim 4 wherein said set of valid tests has the minimum number of tests needed to test each block of said plurality of blocks in said DUT.

6. The method of claim 3 wherein said set of valid tests is sufficient to determine which of said plurality of blocks is non-functional if one of said plurality of blocks is non-functional.

7. The method of claim 6 wherein said set of valid tests has the minimum number of tests needed to determine which of said plurality of blocks is non-functional.

8. The method of claim 1 further comprising displaying a graphical representation of said DUT on a display of said data processing system.

9. The method of claim 8 wherein said graphical representation includes graphical representations of each of said plurality of blocks and a listing of possible tests.

10. The method of claim 9 wherein when a user selects one of said possible tests, blocks that are active during said one of said possible tests are highlighted in said graphical representation.

11. The method of claim 9 wherein a user picks one of said plurality of blocks in said graphical representation and wherein said method lists said possible tests in which said picked block is active.

12. A method for operating a data processing system, said method comprising:
providing a model of a circuit comprising a plurality of blocks connected by wires and a set of control inputs, each block comprising a plurality of ports, each port being either active or inactive, each block being characterized by a set of constraints that limit which ports are active, each constraint in said set of constraints comprising an equation or inequality involving variables representing whether each port is active or inactive, at least one of said constraints in said set of constraints characterizing one of said plurality of blocks involving a variable representing one of said control inputs in said set of control inputs;
causing said data processing system to display a graphical representation of said plurality of blocks and wires;
displaying a list of permitted signal paths within said circuit; and
causing said data processing system to highlight one of said permitted signal paths or a portion thereof in said graphical representation in response to user input to said data processing system.

13. The method of claim 12 wherein said one of said permitted signal paths is displayed in response to said user selecting one of said displayed permitted signal paths.

14. The method of claim 12 wherein said user indicates one of said plurality of blocks in said graphical representation and permitted paths that pass through said indicated block are displayed.

15. The method of claim 12 wherein said permitted signal paths comprise signal paths that satisfy said set of constraints.

16. The method of claim 12 further comprising providing a master set of constraints for said circuit from said sets of constraints provided for each block.

* * * * *